United States Patent [19]

Bowden, III et al.

[11] Patent Number: 5,204,964
[45] Date of Patent: Apr. 20, 1993

[54] METHOD AND APPARATUS FOR RESETTING A MEMORY UPON POWER RECOVERY

[75] Inventors: Raymond D. Bowden, III, Tewksbury, Mass.; Michelle A. Pence, Nashua, N.H.; George J. Barlow, Tewksbury, Mass.; Marc E. Sanfacon, North Chelmsford, Mass.; Jeffrey S. Somers, Lowell, Mass.

[73] Assignee: Bull HN Information Systems Inc., Billerica, Mass.

[21] Appl. No.: 593,917

[22] Filed: Oct. 5, 1990

[51] Int. Cl.$^5$ .............................................. G06F 12/16
[52] U.S. Cl. .................................... 395/750; 365/229; 364/DIG. 1; 364/273; 364/273.4; 364/246.91; 364/DIG. 2; 364/964.9; 364/948.5; 364/948.9
[58] Field of Search ........ 395/750; 365/222, 226–229; 364/DIG. 1, DIG. 2, 707

[56] References Cited

U.S. PATENT DOCUMENTS

4,357,686 11/1982 Scheuneman .................. 365/233 X
4,977,537 12/1990 Dias ..................................... 395/750

Primary Examiner—Michael R. Fleming
Assistant Examiner—Clifford Knoll
Attorney, Agent, or Firm—Gary D. Clapp; John S. Solakian

[57] ABSTRACT

A method and apparatus for resetting memory state when power is applied to the system. The memory has memory elements, a refresh clock and a refresh counter for counting refresh cycles and providing refresh signals to the memory elements, the memory elements and refresh means being connected from the power system and from a battery back-up means. A state detection means is connected from the refresh counter for detecting a change in state of the refresh counter to a state equivalent to the reset state of the refresh counter and asserting a state change signal. A means responsive to the state change signal and to the occurrence of the reset signal provides a memory controller reset signal, so that the memory controller reset signal occurs in synchronization with the change of state of the refresh counter to a state equivalent to the refresh counter reset state. The memory reset further includes a time-out counter means responsive to the assertion of the reset signal and to the refresh clock for counting refresh cycles in synchronization with the refresh counter. A time-out detection means is responsive to the time out counter means for providing a time out signal when the time-out counter has counted a refresh period plus one clock cycle and to the state change signal for providing the memory controller reset signal when the time-out counter has counted a refresh cycle plus one clock period and the state change signal has not been asserted.

4 Claims, 3 Drawing Sheets

METHOD AND APPARATUS FOR RESETTING A MEMORY UPON POWER RECOVERY

Cross References To Related Patent Applications

The following patent applications and patents which are assigned to the same assignee as the present patent application have related subject matter:

1. Data Processing System Having a Bus Command Generated by One Subsystem on Behalf of Another Subsystem, invented by George J. Barlow, Arthur Peters, Richard C. Zelley, Elmer W. Carroll, Chester M. Nibby, Jr., and James W. Keeley, Ser. No. 944,052 filed Dec. 18, 1986, now abandoned.

2. Apparatus and Method of Loading A Control Store Memory of a Central Subsystem, invented by Richard C. Zelley, Mark J. Kenna, Jr., and Wallace A. Martland, Ser. No. 943,980, filed Dec. 18, 1986 and issued Apr. 3, 1990 as U.S. Pat. No. 4,914,576.

3. Apparatus and Method for Loading and Verifying A Control Store Memory of a Central Subsystem, invented by Chester M. Nibby, Jr., Richard C. Zelley, Kenneth E. Bruce, George J. Barlow, and James W. Keeley, Ser. No. 943,984, filed Dec. 18, 1986 and issued Mar. 20, 1990 as U.S. Pat. No. 4,910,666.

4. Apparatus and Method of Loading Different Control Stores of a Multiprocessor to Provide a Multi-Personality System, Invented by Richard C. Zelley, Mark J. Kenna, Jr., and Wallace A. Martland, Ser. No. 943,985, filed Dec. 18, 1986, now abandoned.

5. Universal Peripheral Controller Self-Configuring Bootloadable Ramware, invented by John A. Klashka, Sidney L. Kaufman, Krzysztof A. Kowal, Richard P. Lewis, Susan L. Raisbeck and John L. McNamara, Jr., Ser. No. 925,431, filed Oct. 31, 1986 and issued Feb. 7, 1989 as U.S. Pat. No. 4,803,623.

6. System Management Apparatus for a Multiprocessor System, invented by George J. Barlow, Elmer W. Carroll, James W. Kelley, Wallace A. Martland, Victor M. Morganti, Arthur Peters and Richard C. Zelley, Ser. No 869,164, filed May 30, 1986 and continued as Ser. No. 377,785, filed Jul. 6, 1989.

7. Memory System With Automatic Memory Reconfiguration, invented by Robert B. Johnson, Chester M. Nibby, Jr., and Edward R. Salas, Ser. No. 413,631, filed Sept. 3, 1982 and issued Mar. 26, 1985 as U.S. Pat. No. 4,507,730.

8. Memory Controllers With Burst Mode Capability, invented by Robert B. Johnson and Chester M. Nibby, Jr., Ser. No. 202,819, filed Oct. 31, 1980 and issued Dec. 28, 1982 as U.S. Pat. No. 4,366,539.

9. Resilient Bus System, invented by George J. Barlow and James W. Keeley, Ser. No. 717,201, filed Mar. 28, 1985 and issued Aug. 16, 1988 as U.S. Pat. No. 4,764,862.

10. Multiprocessor Shared Pipeline Cache Memory With Split Cycle and Concurrent Utilization, invented by James W. Keeley and Thomas F. Joyce, Ser. No. 655,473, filed Sept. 27, 1984 and issued Sept. 22, 1987 as U.S. Pat. No. 4,695,943.

11. Method and Apparatus for Performing Health Tests of Units of a Data Processing System, invented by George J. Barlow, Richard C. Zelley, and James W. Keeley, Ser. No. 593,408, filed Oct. 5, 1990.

12. Method and Apparatus for Memory Retry, invented by George J. Barlow, Raymond D. Bowden. III,, and Michelle A. Pence, Ser. No. 593,182, filed Oct. 5, 1990.

13. Method and Apparatus for Integrity Testing of Fault Monitoring Logic, invented by David Cushing, Edward Hutchins, Elmer W. Carroll, and James Bertone, Ser. No. 593,179, filed Oct. 5, 1990.

BACKGROUND OF THE INVENTION

1. Field of Use

The present invention relates to methods and apparatus for initializing system state in a data processing system, in particular for resetting a system memory when power is applied to the system and, more particularly, when power is recovered after a power interrupt.

2. Prior Art

A recurring problem in data processing systems of the prior art is that of re-initializing or resetting the system state when power is applied to the system, either at initial system start-up or upon recovery of power after a power interrupt. This problem is made more complex, in that most systems include a "battery backup" power supply to provide power to certain critical parts of the system during temporary power interruptions, such as the system memory. Battery back-up power to the system memory is used to power the memory elements storing data and the memory refresh circuitry which, as is well known, refreshes data in memory to prevent erosion of the data.

As a result of the use of battery back-up to prevent loss of memory data during power interrupts, there is a major difference between initialization of the system at initial power-on and re-initialization of the system at the end of a power interruption. For example, and as described, battery back-up power is provided to the memory data storage elements and to the memory refresh circuitry, but is usually not provided to other portions of the memory controller circuitry, that is, to the circuitry which controls memory operations during normal system power-on operation. As such, the memory control circuitry must be reset, or reinitialized, at the end of a power interrupt in such a manner as not to disrupt or conflict with the memory refresh operations which have been supported by battery back-up power during the power interruption.

The above is not a problem in certain circumstances, for example, at initial system start-up, because there is no data stored in memory to be protected. Also, it is possible, that recovery of the system after a power interrupt will require complete re-initialization of the memory in the same manner as an initial system start-up. For example, it is possible that a power interruption has continued longer than the period during which batter back-up may provide power. Battery back-up power to the memory elements and refresh circuits would thereby fail, resulting in a loss of stored data.

It is also possible that the power interruption may have occurred in such a manner as to disrupt the refresh operations, thereby causing loss of data and again requiring that the memory be completely re-started. In both cases, the system re-start will also require re-initialization of the memory refresh operations.

It has proven difficult in the prior art to provide a power interrupt re-start capability which can reliably distinguish between a power interrupt condition and an initial start-up condition. It has also proven difficult to provide a power interrupt capability which can distinguish between the case wherein the data in memory has been preserved and the cases wherein the data has been lost, and which can take the corresponding appropriate steps to re-start the memory.

Finally, it has proven difficult to provide a power restart system which reliably avoids disrupting or conflicting with memory refresh operations which have been continued under battery back-up during a power interruption. Most systems have used resistor-capacitor type circuits to detect the resumption of power and to reset the memory control circuits when power has been re-established; this approach has proven unreliable because the resistor-capacitor type circuits provide a reset command to the memory control circuits at variable times, so that the reset, which includes the refresh circuitry, can disrupt the state of operation of the refresh circuitry and thereby result in a loss of data.

OBJECTS OF THE INVENTION

It is therefore an object of the present invention to provide an improved apparatus and method for performing memory controller reset upon power recovery.

It is a further object of the present invention to provide an improved method and apparatus for performing memory controller reset upon power recovery which reliably avoids loss of memory data which has been preserved by battery back-up operation.

SUMMARY OF THE INVENTION

The present invention achieves these objects by treating all power-on operations in the same manner and does not attempt to distinguish between the application of power at system start-up and the recovery of power after a power interruption. That is, the present invention re-sets the memory controller circuitry in the same manner at initial system power-on, at power recovery after a power interrupt in which the data has been preserved, and at power recover after a power recovery in which the data has been lost.

In particular, the memory reset method and apparatus of the present invention avoids the possible loss of data during reset after a power recovery by synchronizing the memory controller re-set operation with the operation of the refresh circuitry, if the refresh circuitry is operating, and forces a memory controller reset only if the refresh circuitry is not operating normally.

The memory reset circuitry will operate, at initial system start-up or upon restoration of power after an interrupt, to determine whether the refresh circuitry is operating to provide refresh addresses to the memory elements. If the refresh circuitry is providing refresh addresses to the memory elements, then the probability is that the memory elements contain valid data and that the memory must be reset such as not to disrupt or conflict with the memory refresh operations, thereby preserving the stored data through the memory reset operation. This is accomplished by asserting the memory controller reset command in synchronization with the refresh counter reaching the count state which is identical with the counters reset state, so that the reset is synchronized with the refresh operation.

If the memory reset circuitry detects that the refresh counter is not operating correctly, by detecting that the refresh counter has not performed a memory refresh cycle within the time period required to refresh all of the memory data storage elements, the power recovery circuitry will proceed to reset the memory controller.

BRIEF DESCRIPTION OF THE DRAWINGS

The foregoing and other objects, features and advantages of the present invention will be apparent from the following description of the invention and embodiments thereof, as illustrated in the accompanying figures, wherein.

DESCRIPTION OF A PREFERRED EMBODIMENT

Figure 1:
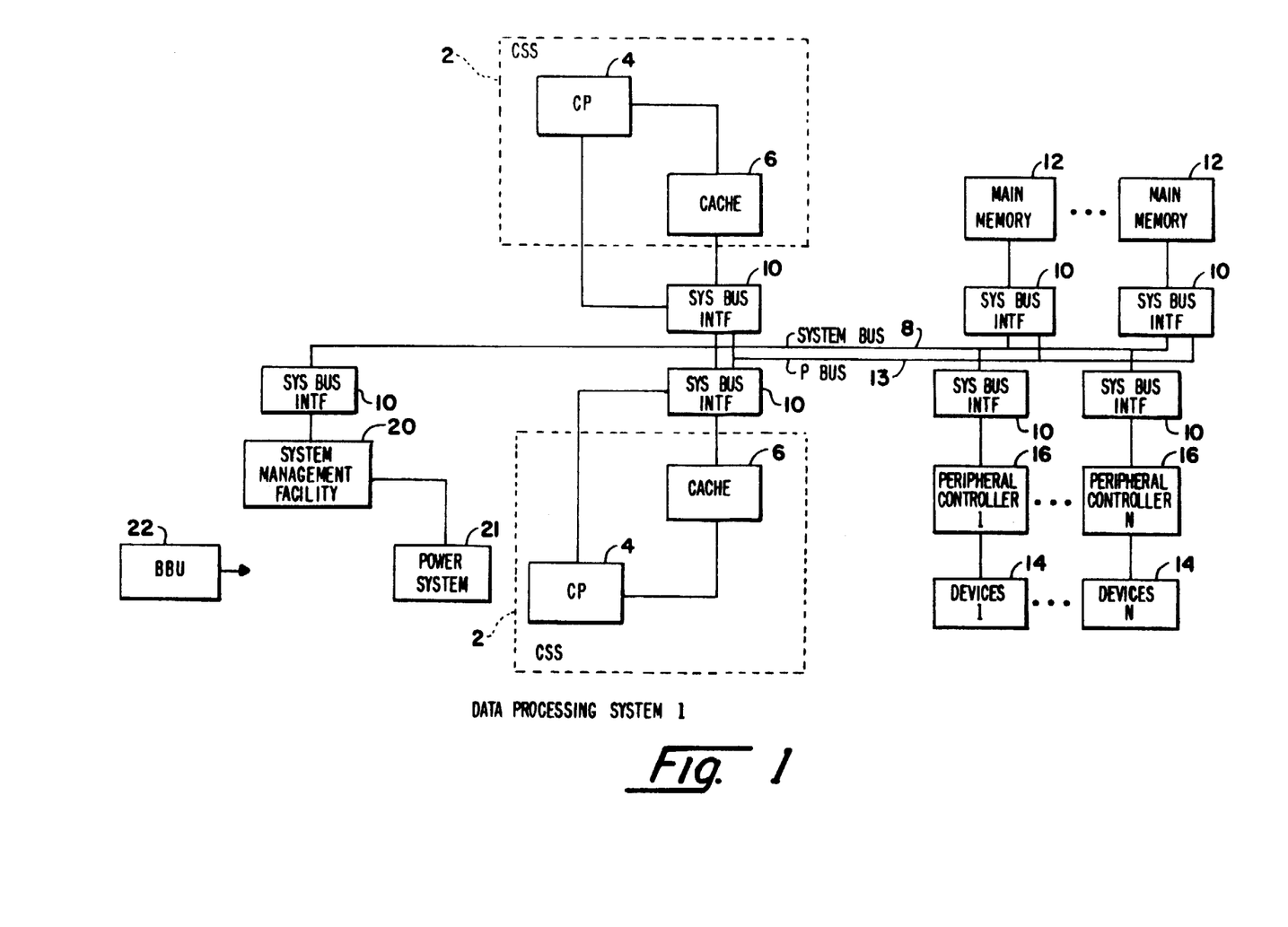
FIG. 1 is a block diagram of an exemplary system incorporating the present invention.

Referring to FIG. 1, therein is represented a block diagram of an exemplary system in which the present invention may be embodied. Data Processing System (DPS) 1 may be, for example, a DPS 6000, Model 600 computer system from Bull HN Information Systems Inc. of Billerica, Mass. The following will describe the structure and operation of DPS 1 only briefly as such systems are generally well known and understood in the art and the exemplary system described specifically herein is described in detail in the previously referenced related patents.

As shown, multiprocessor Data Processing System (DPS) 1 includes a one or more functional units, including one or more Central Sub-Systems (CSSs) 2, each CSS 2 having an independently operating Central Processor (CP) 4 with access to a Cache 6. Each CP 4 and the Cache 6 of each CSS 2 have access to a System Bus (SYSBUS) 8 through a System Bus Interface (SBI)10. DPS 1's functional units include one or more Main Memories 12, which are shared by the CSSs 2 and which are each connected to System Bus 8 through a SBI 10. In addition to SYSBUS 8, DPS 1 includes a Private Bus (PBUS) 13 which is connected between each of Main Memories 12 and each of the CSSs 2 with the Main Memories 12 and the CSSs 2 being connected to PBUS 13 through SBIs 10. PBUS 13 is provided as a means for private, high speed data reads from Main Memories 12 to CSSs 2, while general purpose data transfers and memory write operations are performed through SYSBUS 8.

DPS 1 also includes Peripheral Devices (PDs) 14, such as disk and tape drives and communications devices. Each PD 14 is connected to System Bus 8 through a SBI 10 and an appropriate corresponding Peripheral Device Controller (PDC) 16.

DPS 1's functional units also include a System Management Facility (SMF) 20 providing centralized control of initialization of the DPS 1 system, initialization and control of Quality Logic Testing, that is, system fault testing and detection, and loading of operating system programs into Main Memories 12 and CPUs 2. SMF 20 also controls certain overall system operations, including system timing, monitoring of errors and faults, and monitoring of system operating temperature and system power.

Finally, DSP 1 includes a Power System 21 for providing power to all elements of the system and a Battery Backup Unit (BBU) 22 which, as is well known in the art, provides power to certain of DSP 1's circuitry for a limited period in the event of a power interruption from Power System 21. In particular, BBU 22 is intended to provide power to certain elements of Main Memory 12 to maintain the information stored in memory in an intact state until power is restored, thereby avoiding loss of data and system state and the consequent need to reinitialize DSP 1.

Figure 2:
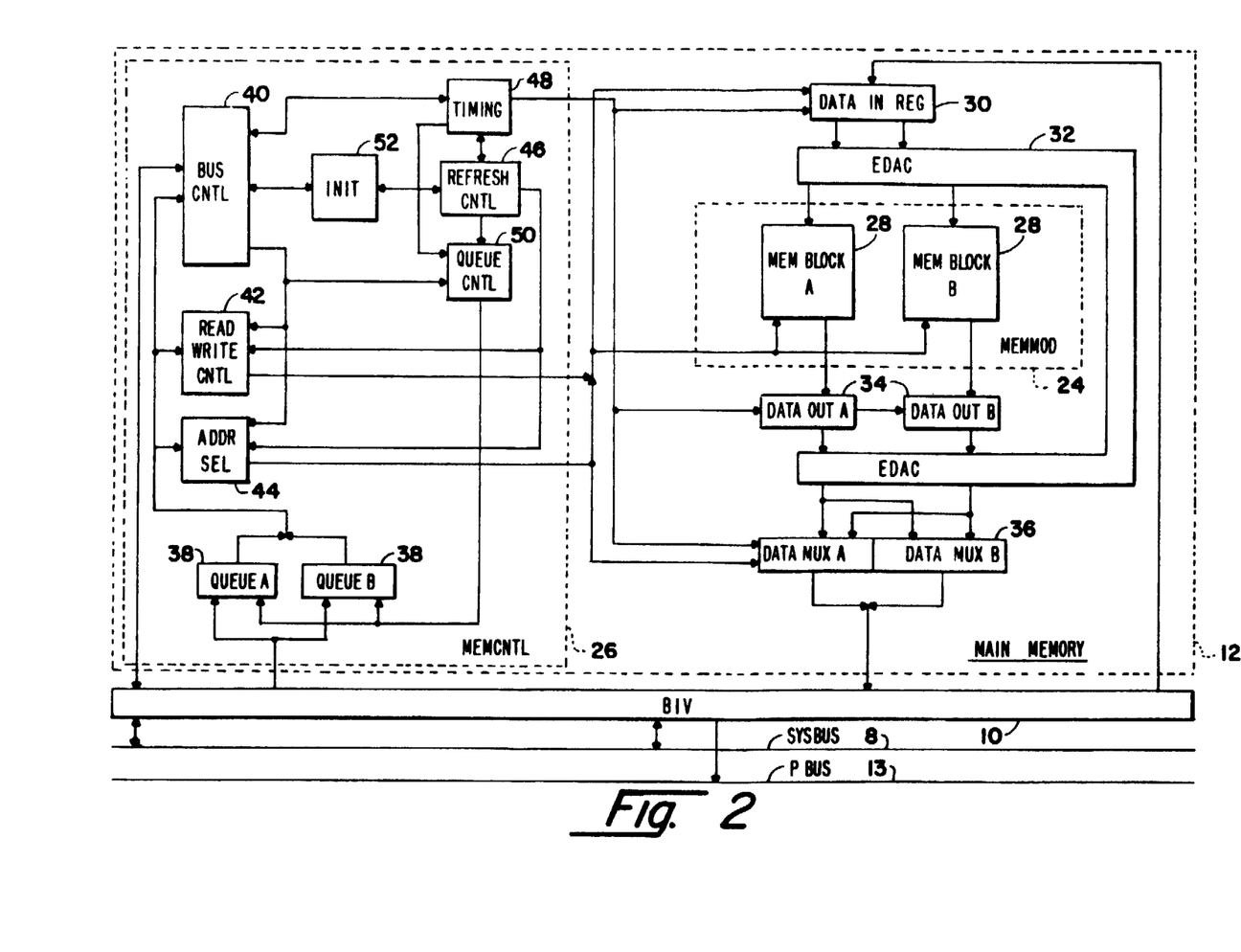
FIG. 2 is a block diagram of a memory of the exemplary system which incorporates the present invention; and, FIG. 3 is a block diagram of exemplary memory logic implementing the present invention.

Referring to FIG. 2, therein is represented an exemplary block diagram of a Main Memory 12 incorporating the present invention. The general structure and operation of a memory such as a Main Memory 12 is well known to those of ordinary skill in the art and is well described in, for example, the previously referenced U.S. Pat. No. 4,507,730 for a Memory System With Automatic Memory Reconfiguration and U.S. Pat. No. 4,366,539 for Memory Controllers With Burst Mode Capability. As such, the following will begin with a general, block diagram description of a Main Memory 12 and will contain detailed descriptions only in the specific area of the present invention.

As shown, Main Memory 12 is comprised of one or more Memory Modules (MEMMOD) 24 containing the actual data storage elements, that is, the memory elements, of the Main Memory 12, and a Memory Controller (MEMCNTL) 26, which contains the logic controlling the operations of the MEMMODs 24.

First considering MEMMOD 24, each MEMMOD 24 of a Main Memory 12 is in turn comprised of one or more blocks of memory elements, such as Memory Blocks (MEMBLOCKs) A and B 28. MEMBLOCKS 28 are customarily organized as rows and columns of addressable memory storage locations. MEMBLOCK A 28 and MEMBLOCK B 28 are further organized as contiguous blocks of addressable memory space, with MEMBLOCK A 28 containing the lower half of the address locations in MEMMOD 24 and MEMBLOCK B 28 containing the upper half of the address locations.

In a present implementation of a MEMMOD 24, using one megabyte DRAMS, MEMMOD 24 is organized as an array of 44 rows by one megabyte columns to store up to 1 megabyte of 44 bit words, wherein each word is comprised of stores a 32 bit double word of data and 12 bits of error detection and correction information. In future implementations, using, for example, 4 megabyte DRAMS, MEMMOD 24 will be organized as a 44 bit by 4 megabyte array. Data to be written into Main Memory 12 is received from SYSBUS 8 through Bus Interface Unit (BIU) 10, which is primarily comprised of line drivers and receivers, and provided to the inputs of a Data In Register (DATAINREG) 30. The data is buffered in DATAINREG 30 and in turn provided from the outputs of DATAINREG 30 as inputs to Error Detection And Correction (EDAC) block 32. As is well understood in the art, EDAC 32 examines the 32 data bits in each input data word and provides as an output both the original 32 bit data word and a further 12 bits of error correcting code, the 32 data bits and the 12 EDAC bits together comprising the 44 bit word that is written into MEMBLOCKs 28.

The 44 bit words from EDAC 32 are provided to the data inputs of MEMBLOCKs A and B 28 and are written into MEMMOD 24 under the control of row and column addresses and a write/read command provided to MEMBLOCKs 28 by MEMCNTL 26, as is well understood in the art.

Data to be read from MEMMOD 24 is read from MEMBLOCKs 28 under control, again, of row and column addresses and a read/write command provided from MEMCNTL 26 and into Data Output buffer registers DATAOUT A 34 and DATAOUT B 34. DATA-OUT A 34 and DATAOUT B 34 are connected from, respectively, the data output lines of MEMBLOCK A 28 and MEMBLOCK B 28. The data stored in DATAOUT A and B 34 is provided as inputs to Error Detection And Correction (EDAC) block 32 which, as again is well understood in the art, uses the 12 bits of error detection and correction information in each 44 bit word to detect and, if possible, correct any errors detected in the 32 data bits.

The corrected data from EDACs 34 is passed to Data Output Multiplexers (DATAMUX) A and B 36, whose outputs are in turn connected through BIU 10 to SYSBUS 8 and PBUS 13. As is well known in the art, the data read from MEMBLOCKs A and B 28 are not necessarily aligned with the appropriate data lines of SYSBUS 8 and PBUS 13, and DATAMUXs A and B 36 are used to align the data words read from MEMMOD 24 with the data lines of SYSBUS 8 and PBUS 13.

Referring now to MEMCNTL 26, requests for memory operations are received from SYSBUS 8 through BIU 10 and into a two deep request QUEUE 38 comprised of a register QUEUE A 38 and a register QUEUE B 38. With the exception of a few types of memory operations, requests for memory operations are generally received into and read from QUEUE A 38 and QUEUE B 38 alternately, so that one request is being executed from one of QUEUE A and B 38 while a new request is being received into the other of QUEUE A and B 38. One exception, for example, is a request for data to be read from a Main Memory 12 to a CSS 2 through PBUS 13 which, as previously described, is provided for private, high speed reads of data from the memory to the system central processors, usually as bursts of several words and, in the exemplary system, of 8 32-bit words. In this case, QUEUE 38 is locked to prevent the Main Memory 12 from receiving any further PBUS 13 requests until the PBUS 13 operation is completed, but will accept any other legal requests. In general, however, MEMCNTL 26 may hold, at any time, up to two requests for memory operations of any type.

The memory operation control inputs to QUEUE A 38 and QUEUE B 38 are comprised of an address field, designating the address in Main Memory 12 that data is to be written into or read from, a field of control bits carrying information and commands controlling what memory operations are to be performed and the state of memory operations, and a set of bus handshake and timing lines for controlling the operations of Main Memory 12 with respect to SYSBUS 8. The inputs and outputs of Main Memory 12, including the previously discussed inputs and outputs of MEMMOD 24, are described in further detail in Appendix A, titled Memory Subsystem Interface Lines, and are described further in the previously referenced U.S. Pat. No. 4,507,730 for a Memory System With Automatic Memory Reconfiguration and U.S. Pat. No. 4,366,539 for Memory Controllers With Burst Mode Capability and will not be discussed in further detail herein.

As shown, the memory request command information from QUEUE 38 are provided as inputs to the other elements of MEMCNTL 26, most particularly to Bus Control Logic (BUS CNTL) 40, Read/Write Control (READ/WRITE CNTL) 42, and Address Selection Logic (ADDRSEL) 44.

BUS CNTL 40 is implemented as a state machine which contains logic which receives memory and bus operation control bits from QUEUE 38, from other elements of MEMCNTL 26, and bus control signals, as listed in Appendix A, from SYSBUS 8 and provides, in turn, detailed control signals for controlling the operations of the elements of Main Memory 12 and certain of the bus command and handshake signals to the control lines of SYSBUS 8. The general structure and operation of a BUS CNTL 40 is well known in the art and is described in U.S. Pat. No. 4,507,730 for a Memory System With Automatic Memory Reconfiguration and U.S. Pat. No. 4,366,539 for Memory Controllers With Burst Mode Capability.

READ/WRITE CNTL 42 receives the read/write command bit from QUEUE 38 and in turn generates read and write commands to MEMBLOCKs 28 as necessary to execute the requested operations.

ADDRSEL 44, in a similar manner, receives the read/write address bits of each memory request and generates the appropriate row and column addresses to the memory elements of MEMBLOCKs 28. It should be noted that MEMBLOCKs 28 are usually comprised of Dynamic Random Access Memory elements (DRAMs) and, as such, require periodic refreshing to protect the data stored therein from erosion. As is well known, such refresh is usually performed by periodically reading each of the memory elements of MEMBLOCKs 28, the refresh readings of MEMBLOCKs 28 being performed in the intervals between requested memory reads and writes.

Refresh of MEMBLOCKs 28 is performed under control of Refresh Control (REFRESH CNTL) 46, which contains a counter for generating successive row addresses for MEMBLOCKs 28. The refresh row addresses are provided from REFRESH CNTL 46 to ADDR SEL 44, and provided in turn from ADDR SEL 44 to the row address inputs of MEMBLOCKs 28, so that the memory elements of MEMMOD 24 are refreshed a row at a time.

MEMCNTL 26 further includes a TIMING block 48, which is responsive to the system clock to generate timing control signals and clocks to the elements of Main Memory 12, a Queue Control (QUEUE CNTL) 50, which is responsive to the operations of Main Memory 12 to generated control signals to QUEUE 38, and Initialization Logic (INIT) 52, which contains circuitry for initializing the state of Main Memory 12's individual elements at system power-on and after power interrupts.

Finally, MEMCNTL 26 is provided with three further inputs pertaining to the present invention. The first is a power input, BBUPWR, from System 1's Battery Backup Unit (BBU) 22 which, as shown, is provided to MEMBLOCKs 28 and to READ/WRITE CNTL 42, ADDRSEL 44, REFRESH CNTL 46, TIMING 48 and INIT 52 of MEMCNTL 26. As previously described, a primary function of BBU 22 is to provide power to Main Memory 12 in the event of a power interruption so as to maintain the information stored in memory in an intact state until power is restored, thereby avoiding loss of data and the need to reinitialize DPS 1.

The second input is the Bus Master Clear (BSMCLR) signal from SYSBUS 8, which is described further in Appendix A. BSMCLR may be asserted by a DPS 1 system element having administrative control over SYSBUS 8 whenever the system is to be reset, such as SMF 20. System reset generally occurs at each each initial power-on of the system and at the end of each power interrupt, when power is restored to the system. In these instances BSMCLR is asserted by SMF 20, which, as described previously and in the reference patents, has administrative control over system operation, and indicates that power has been provided to the system and has stabilized.

The third input is Bus Power On (BSPWON), which is asserted when power returns to the system. As described below, BSMCLR is provided to INIT 52 for use in controlling initialization of Main Memory 12 at initial power-on of the system and upon power restoration after a power interruption. As regards the present invention, the assertion of BSMCLR which occurs after the assertion BSPWON, that is, after power has been restored to the system, is of significance in that it is this assertion of BSMCLR which initiates the operation of the power failure recovery circuitry.

Figure 3:
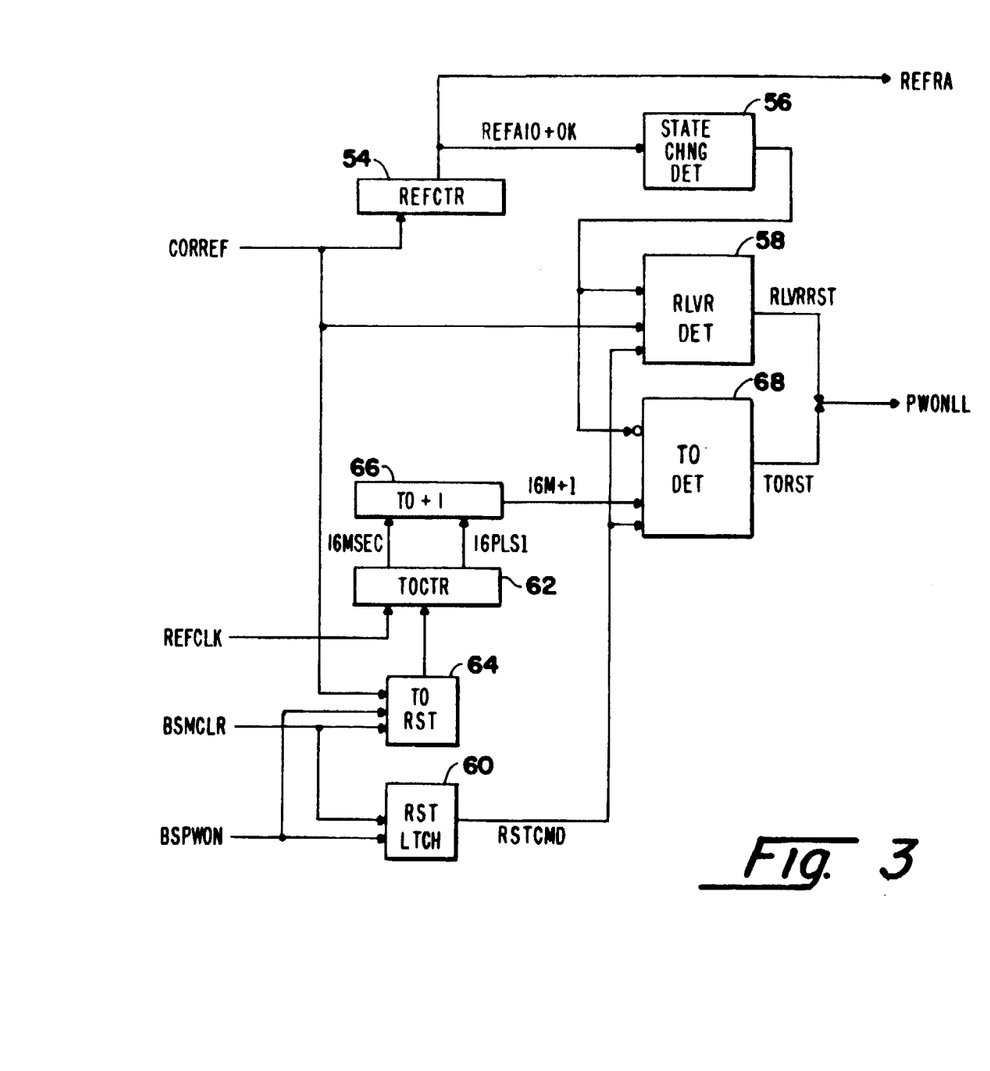

Referring now to FIG. 3, therein is shown a functional diagram of the operations performed by the power-on recovery circuitry of the present invention.

As was described, REFRESH CNTL 46 and the memory elements of MEMBLOCKs 28 are among those elements of the system which are provided with battery back-up power from BBU 22 so that these elements will remain in operation during a power interrupt, thereby preserving the data stored in MEMBLOCKs 28.

As was also described, MEMCNTL 26 is generally, with the exception of REFRESH CNTL 46, TIMING 48 and INIT 52, not provided with power from BBU 22 so that it is necessary to reset, or restart, those portions of MEMCNTL 26 in synchronization with the operations of REFRESH CNTL 46 when power is restored to the system.

As shown in FIG. 3, REFRESH CNTL 46 includes a counter for generating successive row addresses (REFRA) for MEMBLOCKs 28; this counter is represented in FIG. 3 as Refresh Counter (REFCTR) 54 and is driven by a 15 microsecond period clock designated as Core Refresh (CORREF). The refresh row addresses are generated as successive counts from REFCTR 54, that is, the contents of REFCTR 54 are provided to MEMBLOCKs 28 as row addresses as REFCTR 54 counts successive CORREF clock pulses. The refresh of each row of MEMBLOCKs 28 is thereby performed in a 15 microsecond refresh clock cycle, and the refresh period for MEMBLOCKs 28, that is, the time required to refresh all rows of MEMBLOCKs 28, is 16 milliseconds in the present implementation of MEMMOD 24.

The remaining portions of the power-on recovery circuitry are contained within INIT 52. In the presently preferred embodiment of the invention, these functions are implemented in a Programmable Logic Array (PAL), for example, a 22V10 from, for example, American Micro Devices (AMD) or Lattice Corporation, and the equations for such a PAL implementation are presented in Appendix B.

Assume for the initial portions of the following description of the power recovery circuitry that the system has suffered a power interruption and that BBU 22 has maintained power to the memory elements and refresh circuitry of Main Memory 12, so that the data present in MEMBLOCKs 28 at the time of power interruption have been preserved. As will be described, the power recovery circuitry of the present invention will operate to reset the memory controller elements of Main Memory 12 upon restoration of power, as indicated by the assertion of BSMCLR, without disrupting the normal refresh operations and without risk of destroying the data preserved in MEMBLOCKs 28.

As shown, a State Change Detector (STATE CHNG DET) 56 is connected from the outputs of REFCTR 54 to detect changes in state in the count presently in REFCTR 54. In particular, STATE CHNG DET 56 detects and indicates when REFCTR 54's count rolls-over from a count of all "1"s, that is, a full count, to all "0"s. The roll-over of REFCTR 54 to a state of all "0"s is significant in synchronizing the reset of REFCTR 54 with refresh operations for two reasons. First, the roll-over of REFCTR 54 indicates that REFCTR 54 is performing refresh cycles because, if REFCTR 54 is operating normally, the roll-over of REFCTR 54 occurs only when REFCTR 54 has completed refresh of all of the rows of MEMBLOCKs 28. That is, the roll-over will occur at the end of the period required to refresh all of the rows of MEMBLOCKs 28 and will occur within this period only if REFRESH CNTL 46 is operating normally.

Secondly, the roll-over from a state of all "1"s to all "0"s is significant because a state of all "0"s is identical to the reset state of REFCTR 54. Resetting REFCTR 54 when REFCTR 54 rolls-over, that is, goes to a state of all "0"s, will therefore not disrupt or interfere with the generation of refresh addresses to the memory elements because the counted state of all "0"s is identical to the reset state of all "0"s.

The change of state detected by STATE CHNG DET 56 is provided as an input to Roll-Over Detector (RLVR DET) 58, together with an input from CORREF, so that RLVR DET 58 will generate a Roll-Over Reset (RLVRRST) output synchronized with CORREF when the count in REFCTR 54 reaches all "0"s. RLVRRST may then be used as Power On Latched (PWONLL) to reset all Main Memory 12 circuitry, including REFCTR 54 and the remainder of the refresh circuitry, at the same point in time as REFCTR 54 reaches its reset state by its normal operation of counting refresh cycles. The elements of Main Memory 12 will thereby be reset and synchronized with the operations of REFRESH CNTL 48, but without disrupting or conflicting with normal refresh operations.

It should be noted that RLVRRST and PWONLL must be inhibited except when Main Memory 12 is to be reset, as indicated by the assertion of the first BSMCLR to occur after the assertion of BSPWON. For this reason, BSMCLR and BSPWON are used as gating inputs to reset Reset Latch (RST LTCH) 60, the RESET COMMAND (RSTCMD) output of which is provided as an enabling input to RLVR DET 58. RST LTCH 60 is reset by the assertion of PWONLL, to inhibit the operation of RLVR DET 58 until the next assertion of the first BSMCLR to occur after BSPWON, as indicated by the inputs to RST LTCH 60.

The above described operation has assumed that the system was in full operation, that there was a power interruption, and that memory data and refresh operations were preserved by the operation of BBU 22. The portions of the power recovery circuitry not yet discussed deal with the instances when power is initially provided to the system at system start-up and when there has been a power interrupt, but data has been lost, for example, by the interruption exceeding the capacity of BBU 22 or because the refresh operations have otherwise failed to operate correctly during the interrupt.

In these instances, the reset of Main Memory 12's elements will be controlled through operation of a Time-Out Counter (TOCTR) 62. TOCTR is normally held in the reset state by a Time-Out Reset command provided from Time-Out Reset (TORST) 64 and is released to count when TORST 64 is released by the assertion of the first BSMCLR occurring after the assertion of BSPWON and the occurrence of a clock input from CORREF. The release of TOCTR 64 to count is gated with CORREF so that TOCTR 64 will begin counting in synchronization with refresh clock CORREF period of REFCTR 54. As shown, TOCTR 62 is clocked by a clock input designated as REFCLK and counts 16 millisecond periods; that is, each complete counting period of TOCTR 62 is one complete refresh period, the time required to refresh all of the rows of MEMBLOCKs 28. The outputs of TOCTR 62 are a 16MSEC signal, indicating that TOCTR 62 has counted one complete refresh period, and a 16PLS1 signal, indicating that one clock period past the complete 16 millisecond period. The concurrence of 16MSEC and 16PLS1 are detected by logic TO+1 66, which in turn generates an output 16M+1 indicating that TOCTR 62 has counted one complete refresh period plus once REFCLK cycle. 16M+1 thereby indicates that a complete refresh period plus one clock period has occurred since the assertion of BSMCLR and the start of counting by TOCTR 62 in synchronization with the refresh clock.

State logic Time-Out Detect (TODET) 68 monitors the state of the output of STATE CHNG DET 56 and the state of signal 16M+1. As was described, the output of STATE CHNG DET 56 indicates when REFCTR 54 completes a refresh period, that is, has rolled-over within the time period required to refresh all of the rows of MEMBLOCKs 28.

If REFCTR 54 has rolled-over, then REFCTR 54 is operating correctly and generating refresh addresses for MEMBLOCKs 28. In this case, the roll-over of REFCTR 54, as indicated by the output of STATE CHNG DET 56, will occur before the conclusion of the 16 millisecond counting period of TOCTR 62 and RLVR DET 58 will have asserted RLVRRST as PWONLL to reset Main Memory 12's controller circuitry, including TOCTR 62 and TORST 64, as described above.

If STATE CHNG DET 56 has not indicated the roll-over of REFCTR 54 before the assertion of 16M+1, that is, before TOCTR 62 has counted a complete refresh period plus one clock period since the assertion of BSMCLR and the start of counting by TOCTR 62 in synchronization with the refresh clock, then REFCTR 54 is not counting refresh cycles. This in turn is an indication that either BSMCLR has been asserted as a result of an initial system start-up or that REFCTR is not operating to count refresh addresses. TODET 68 will then assert a Time-Out Reset signal (TORST) when signal 16M+1 is asserted. TORST will then be provided as PWONLL to reset the circuitry of MEMCNTL 26, including REFCTR 54.

In summary then, the power recovery circuitry illustrated in FIG. 3 does not attempt to distinguish between the application of power to the system at initial system start-up and the restoration of power at the end of a power interruption, but operates in the same manner in both instances to reset the memory controller. The power recovery circuitry first attempts to perform a memory controller reset synchronized with the memory refresh operation and, only if memory refresh is not operating, will the power recovery circuitry force a reset of the memory controller circuits.

As was described the power recovery circuitry will operate, upon assertion of BSMCLR at initial system start-up or upon restoration of power after an interrupt, to determine whether the refresh circuitry is operating to provide refresh addresses to the memory elements. If the refresh circuitry is providing refresh addresses to the memory elements, then the probability is that the memory elements contain valid data and that the memory controller must be reset such as not to disrupt or conflict with the memory refresh operations, thereby preserving the stored data through the memory reset operation. This is, as described, accomplished by asserting the memory controller reset command in synchronization with the refresh counter reaching the count state which is identical with the counters reset state, so that the reset is synchronized with the refresh operation.

If the power recovery circuitry detects, upon power on as indicated by the assertion of BSMCLR, that the refresh counter has not rolled-over, that is, has not completed a refresh period within the time normally required to refresh all rows of the memory storage elements, the power recovery circuitry will proceed to force a reset of the memory controller circuits.

While the invention has been particularly shown and described with reference to a preferred embodiment of the method thereof, it will be understood by those of ordinary skill in the art that various changes in form, details and implementation may be made therein without departing from the spirit and scope of the invention as defined by the appended claims.

Appendix A

| MEMORY SUBSYSTEM INTERFACE LINES | |
|---|---|
| Designation | Description |
| | Address Lines |
| BSAD00-BSAD23 | The bus address lines constitute a twenty-four bit wide path used in conjunction with the bus memory reference line BSMREF to transfer a 24-bit address to controller 200 or a 16-bit identifier from controller 200 to the bus (for receipt by a slave unit). When used for memory addressing, the signals applied to lines BSAD00-BSAD03 select a particular 512K word module, the signals applied to lines BSAD04-BSAD22 select one of the 512K words in the module while the signal applied to line BSAD23 selects one of the bytes within the selected word (i.e., BSAD23 = 1 = right byte; BSAD23 = 0 = left byte). When used for identification, lines BSAD00-BSAD07 are not used. The lines BSAD08-BSAD23 carry the identification of the receiving unit as transmitted to controller 200 during the previous memory read request. |
| BSAP00 | The bus address parity line is a bidirectional line which provides an odd parity signal for the address signals applied to lines BSAD00-BSAD07. |
| | Data Lines |
| BSDT00-BSDT15, BSDT16-BSDT31 | The sets of bus data lines constitute a 32-bit or two word wide bidirectional path for transferring data or identification information between controller 200 and the bus as a function of the cycle of operation being performed. During a write cycle of operation, the bus data lines transfer information to be written into memory at the location specified by the address signals applied to lines BSAD00-BSAD23. During the first half of a read cycle of operation, the data lines BSDT00-BSDT15 transfer identification information (channel number) to the controller 200. During the second half of the read cycle, the data lines transfer the information read from memory. |
| BSDP00, BSDP08, BSDP16, BSDP24 | The bus data parity lines are two sets of bidirectional lines which provide odd parity signals coded as follows: BSDP00 = odd parity for signals applied to lines BSDT00-BSDT07 (left byte). |

BSDP08 = odd parity for signals applied to lines BSDT08-BSDT15 (right byte);
BSDP16 = odd parity for signals applied to lines BSDT16-BSDT23, and
BSDP24 = odd parity signals applied to lines BSDT24-BSDT31.

Control Lines

BSMREF  The bus memory reference line extends from the bus to the memory controller 200. When set to a true state, this line signals the controller 200 that the lines BSAD00-BSAD23 contain a complete memory controller address and that it is performing a write or read operation upon the specified location. When reset to a false state, the line signals controller 200 that the lines BSAD00-BSAD23 contain information directed to another unit and not controller 200.

BSWRIT  The bus write line extends from the bus to the memory controller 200. This line when set to a true state, in conjunction with line BSMREF being true, signals controller 200 to perform a write cycle of operation. When reset to a false state, this line, in conjunction with line BSMREF being true, signals controller 200 to perform a read cycle of operation.

BSBYTE  The bus byte line extends from the bus to controller 200. This line, when set to a true state, signals controller 200 that it is to perform a byte operation rather than a word operation.

BSLOCK  The bus lock line extends from the bus to controller 200. When set to a true state, this line signals controller 200 of a request to perform a test or change the status of a memory lock flip-flop included within the controller 200.

BSSHBC  The bus second half bus cycle line is used to signal a unit that the current information applied to the bus by controller 200 is the information requested by a previous read request. In this case, both controller 200 and the unit receiving the information are busy to all units from the start of the initiation cycle until controller 200 completes the transfer. This line is used in conjunction with the BSLOCK line to set or reset its memory lock flip-flop. When a unit is requesting to read or write and line BSLOCK is true, the line BSSHBC, when true, signals controller 200 to reset its lock flip-flop. When in a false

| | |
|---|---|
| BSMCLR | state, it signals controller 200 to test and set its lock flip-flop. The bus master clear line extends from the bus to controller 200. When this line is set to a true state, it causes the controller 200 to clear to zeros certain bus circuits within controller 200. |
| BSDBWD | The double word line is a unidirectional line which extends from the controller 200 to bus 10. This line together with the BSDBPL line is used during read requests to indicate how many words of data and in what format are being provided by memory controller 200. During read response cycles from memory controller 200, the state of line BSDBWD indicates whether one or two words of data are being applied to bus 10. When line BSDBWD is forced to a binary ONE state, this indicates that two words are being transferred. When only one word is being transferred, line BSDBWD is forced to a binary ZERO. |
| BSDBPL | The double pull line is a bidirectional line which extends between controller 200 and bus 10. This line together with line BSDBWD indicates whether the response is the first (not the last) or the last unit of data requested. |
| | Bus Handshake/Timing Lines |
| BSREQT | The bus request line is a bidirectional line which extends between the bus and controller 200. When set to a true state, it signals the controller 200 that another unit is requesting a bus cycle. When reset to a false state, it signals controller 200 that there is no bus pending bus request. This line is forced to a true state by controller 200 to request a read second half bus cycle. |
| BSDCNN | The data cycle line is a bidirectional line which extends between the bus and controller 200. When forced to a true state, the line signals the controller 200 that a unit was granted a requested bus cycle and placed information on the bus for another unit. The controller 200 forces the line to a true state to signal that it is transmitting requested data back to a unit. Prior to this, controller 200 had requested and been granted a bus cycle. |
| BSACKR | The bus acknowledge line is a bidirectional line which extends between the bus and controller 200. When set to a binary ONE by controller 200, the line signals that it is accepting a bus transfer during a read first half bus cycle or write cycle. During a read second half bus cycle, this line when set to a binary ONE by the unit which originated the request signals the controller 200 of its acceptance of a transfer. |
| BSWAIT | The bus wait line is a bidirectional line which extends between the bus and controller 200. When set to a true or binary ONE state by controller 200, it signals a requesting unit that the controller cannot accept a transfer at this time. Thereafter, the unit will initiate successive retries until the controller 200 acknowledges the transfer. The controller 200 sets the BSWAIT line true under the following conditions: 1. It is busy when all queue registers are full. 2. It is busy when placed in an initialize mode. When the BSWAIT line is set to a true or binary ONE state by a unit, this signals the controller 200 that the data is not being accepted by the requesting unit and to terminate its present bus cycle of operation. |
| BSNAKR | The bus negative acknowledge line is a bidirectional line which extends between the bus and controller 200. When this line is set to a true or binary ONE state by controller 200, it signals that it is refusing a specified transfer. The controller 200 sets line BSNAKR to a true state as follows: 1. Memory lock flip-flop is set to a binary ONE, and 2. The request is to test and set the lock flip-flop (BSLOCK true and BSSHBC false). In all other cases, when the memory lock flip-flop is set, controller 200 generates a response via the BSACKR line or the BSWAIT line or generates no response. When the BSNAKR line is forced true by a unit, this signals controller 200 that the data is not accepted by the unit and to terminate its cycle of operation. |
| | Tie Breaking Control Lines |
| BSAUOK-BSIUOK | The tie breaking network lines extend from the bus to controller 200. These lines signal controller 200 whether units of higher priority have made bus requests. When all the signals on these lines are binary ONES, this signals controller 200 that it has been granted a bus cycle at which time it is able to force the BSDCNN line to a binary ONE. When any one of the signals on the lines is a binary ZERO, this signals controller 200 that it has not been granted a bus cycle and is inhibited from forcing line BSDCNN to a binary ONE. |
| BSMYOK | The tie breaking network line extends from controller 200 to the bus. Controller 200 forces this line to a false or binary ZERO state to signal other units of lower priority of a bus request. |
| BSYELO | The bus yellow line is a bidirectional line. When set to a true state during the second half of a bus cycle in response to a read command, it indicates that the accompanied transferred information has been successfully corrected. When set to a true state during a memory read request, this line indicates that the read request is to be interpreted as a diagnostic command. |

Appendix B

```
PARTNO    PAL22CV10-15;
NAME      MXM13-F ;
DATE      08/09/89 ;
REV       F ;
```

```
              DESIGNER  Michelle A. Pence ;
              COMPANY   Bull HN;
              ASSEMBLY  BF8MXM 2.2;
              LOCATION  AM02;
              DEVICE    P22V10 ;

/*      CUPL VERSION 3.0            */
/*      MINIMIZATION LEVEL m1       */

/*********************************************************************/
/*
 *
 *
 *                         P22V10
 *
 *                        ___ ___
 *                       |   \/   |
 *         REFCLK+00  - |  1   24 | - + 5 VOLTS
 *         REFA10+OK  - |  2   23 | - MYQLTO+00
 *         REFAD3+OK  - |  3   22 | - MYQLTO-00
 *         CORREF+00  - |  4   21 | - PWONLL+00
 *         UNUSED     - |  5   20 | - PWONLL-00
 *         LOGIC1+05  - |  6   19 | - 16MRST-00
 *         UNUSED     - |  7   18 | - Q0
 *         UNUSED     - |  8   17 | - Q1
 *         BSPWON+OK  - |  9   16 | - Q2
 *         BSMCLR+OK  - | 10   15 | - Q3
 *         UNUSED     - | 11   14 | - Q4
 *             GROUND - | 12   13 | - 16MSEC+00
 *                       |________|
 *
 *
 *
 *
 */
/*********************************************************************/
/*********************************************************************/
/*                      Functional Overview                           */
/*  This is the state machine which allows the memory controller to   */
/*  power up from either a cold start or a battery backup situation   */
/*  and be fully functional. DRAM contents are not zeroed.            */
/*  When BSPWON becomes true, the state machine waits for BSMCLR to   */
/*  be true. MYQLTO is now turned on. After BSMCLR becomes false, it  */
/*  waits for CORREF to be true then false. Now the state of the      */
/*  board is known. REFA10 is sampled, and 16MRST asserted (low).     */
/*  On the falling edge of CORREF, REFA10 is sampled again. If it has */
/*  changed state, the refresh counters have turned over to 0, so it  */
/*  is safe to reset the board. If REFA10 hasn't changed state, check */
/*  to see if the 16ms timer has timed out. If it has, refresh is not */
/*  working, so it is safe to reset the board. If the timer hasn't    */
/*  timed out, check on REFA10 again. Resetting the board consists    */
/*  of bringing PWONLL low for 5 states, then bringing it high.       */
/*  Next, the state machine monitors REFAD3. When it becomes true, 8  */
/*  refresh cycles have been done (a DRAM requirement before          */
/*  operation) and MYQLTO is turned off. BSPWON brings it back to     */
/*  monitoring for BSMCLR.                                            */
/*********************************************************************/

/* INPUTS */

PIN  1 = REFCLK;        /* REFCLK+00 */
PIN  2 = REFA10;        /* REFA10+OK */
PIN  3 = REFAD3;        /* REFAD3+OK */
PIN  4 = CORREF;        /* CORREF+00 */
PIN  6 = LOGIC1;        /* LOGIC1+05 */
PIN  9 = BSPWON;        /* BSPWON+OK */
PIN 10 = BSMCLR;        /* BSMCLR+OK */
PIN 13 = 16MSEC;        /* 16MSEC+00 */

/* OUTPUTS */
```

```
PIN 18  =  Q0;          /* LSB OF STATE COUNTER */
PIN 17  =  Q1;          /* 2ND BIT OF STATE COUNTER */
PIN 16  =  Q2;          /* 3RD BIT OF STATE COUNTER */
PIN 15  =  Q3;          /* 4TH BIT OF STATE COUNTER */
PIN 14  =  Q4;          /* MSB OF STATE COUNTER */
PIN 19  =  16MRST;      /* 16MRST-00 */
PIN 21  =  PWONLL;      /* PWONLL+00 */
PIN 20  =  PWONLLm;     /* PWONLL-00 */
PIN 23  =  MYQLTO;      /* MYQLTO+00 */
PIN 22  =  MYQLTOm;     /* MYQLTO-00 */

MIN Q0 =0;
MIN Q1 =0;
MIN Q2 =0;
MIN Q3 =0;
MIN Q4 =0 ;
MIN 16MRST =0;
MIN PWONLL =0;
MIN PWONLLm =0;
MIN MYQLTO =0;
MIN MYQLTOm =0;

/***********************************************************************/

/*
LOGIC EQUATIONS

NEXT STATE EQUATIONS: */

Q4.D =  !Q4 & !Q3 &  Q2 & !Q1 &  Q0 & REFA10 & BSPWON
     # !Q4 &  Q3 & !Q2 & !Q1 & !Q0 & REFA10 & BSPWON
     # !Q4 &  Q3 &  Q2 & !Q1 & !Q0 & 16MSEC & BSPWON
     #  Q4 & !Q3        & !Q1 &  Q0 & BSPWON
     #  Q4 & !Q3        & !Q1 & !Q0 & BSPWON
     #  Q4 &  Q3        & !Q1 & !Q0 & BSPWON
     #  Q4 &  Q3 & !Q2 &  Q1       & BSPWON
     #  Q4 & !Q3 & !Q2 &  Q1 & !Q0 & BSPWON
     # !Q4 & !Q3 & !Q2 &  Q1 & !Q0 & REFAD3 & BSPWON;

Q4.OE = LOGIC1;

Q3.D = !Q4 & !Q3 &  Q2 & !Q1 &  Q0 & !REFA10 & BSPWON
     # !Q4 &  Q3        & !Q1        & BSPWON
     #  Q4 & !Q3 & !Q2 & !Q1 & !Q0 & !REFA10 & BSPWON
     #  Q4 & !Q3 &  Q2 & !Q1 & !Q0 &  16MSEC & BSPWON
     #  Q4 &  Q3        & !Q1 & !Q0 & BSPWON
     #  Q4 &  Q3 & !Q2 &  Q1 & !Q0 & BSPWON
     # !Q4        & !Q2 &  Q1 &  Q0 & BSPWON;

Q3.OE = LOGIC1;

Q2.D =  !Q4 & !Q3 & !Q2 & !Q1 & !Q0 & BSMCLR & BSPWON
     #  !Q4 & !Q3 &  Q2 & !Q1 & !Q0 & BSPWON
     #  !Q4 & !Q3 &  Q2 &  Q1 & !Q0 & BSPWON
     #  !Q4 & !Q3 &  Q2 &  Q1 &  Q0 & BSPWON
     #  !Q4 & !Q3 &  Q2 & !Q1 &  Q0 & BSPWON
     #  !Q4 &  Q3 &  Q2 & !Q1 &  Q0 & !CORREF & BSPWON

#  !Q4 &  Q3 & !Q2 & !Q1 & !Q0 & !REFA10 & BSPWON
     #  !Q4 &  Q3 &  Q2 & !Q1 & !Q0 & BSPWON
     #   Q4 & !Q3 &  Q2 & !Q1 &  Q0 & !CORREF & BSPWON
     #   Q4 & !Q3 & !Q2 & !Q1 & !Q0 & REFA10 & BSPWON
     #   Q4 & !Q3 &  Q2 & !Q1 & !Q0 & BSPWON;

Q2.OE = LOGIC1;

Q1.D =   !Q4 & !Q3 &  Q2 & !Q1 & !Q0 & !BSMCLR & BSPWON
```

```
    #   !Q4 &  !Q3 &   Q2 &   Q1 &  !Q0 & BSPWON
    #   !Q4 &  !Q3 &   Q2 &   Q1 &   Q0 & CORREF & BSPWON
    #    Q4 &   Q3 &  !Q2 &  !Q1 &  !Q0 & BSPWON
    #          Q3 &  !Q2 &   Q1          & BSPWON
    #         !Q3 &  !Q2 &   Q1          & BSPWON;

Q1.OE = LOGIC1;

Q0.D =  !Q4 &  !Q3 &   Q2 &   Q1 &  !Q0 & CORREF & BSPWON
    #   !Q4 &  !Q3 &   Q2 &   Q1 &   Q0 & BSPWON
    #   !Q4          &   Q2 &  !Q1 &   Q0 & BSPWON
    #   !Q4 &   Q3 &  !Q2 &  !Q1 &   Q0 & CORREF & BSPWON
    #   !Q4 &   Q3 &   Q2 &  !Q1 &  !Q0 & !16MSEC & BSPWON
    #    Q4 &  !Q3 &   Q2 &  !Q1 &   Q0 & BSPWON
    #    Q4 &  !Q3 &  !Q2 &  !Q1 &   Q0 & CORREF & BSPWON
    #    Q4 &  !Q3 &   Q2 &  !Q1 &  !Q0 & !16MSEC & BSPWON
    #    Q4 &   Q3 &  !Q2 &   Q1          & BSPWON
    #         !Q3 &  !Q2 &   Q1 &   Q0 & BSPWON;

Q0.OE = LOGIC1;

/*    OUTPUT EQUATIONS:      */

!MYQLTO.D = !BSPWON
        #  !Q4 &  !Q3 &  !Q2 &  !Q1 &  !Q0 & !BSMCLR & BSPWON
        #  !Q4 &  !Q3 &  !Q2 &   Q1 &   Q0 & REFAD3 & BSPWON
        #   Q4 &  !Q3 &  !Q2 &   Q1 &  !Q0 & BSPWON;

MYQLTO.OE = LOGIC1;

MYQLTOm.D = !BSPWON
        #  !Q4 &  !Q3 &  !Q2 &  !Q1 &  !Q0 & !BSMCLR & BSPWON
        #  !Q4 &  !Q3 &  !Q2 &   Q1 &   Q0 & REFAD3 & BSPWON
        #   Q4 &  !Q3 &  !Q2 &   Q1 &  !Q0 & BSPWON;

MYQLTOM.OE = LOGIC1;

!PWONLL.D = !Q4 &   Q3 &  !Q2 &  !Q1 &  !Q0 & REFA10 & BSPWON
        #   Q4 &  !Q3 &  !Q2 &  !Q1 &  !Q0 & !REFA10 & BSPWON
        #   Q4 &   Q3 &   Q2 &  !Q1 &  !Q0 & BSPWON
        #   Q4 &   Q3 &  !Q2          &  !Q0 & BSPWON
        #                !Q2 &   Q1 &   Q0 & BSPWON;

PWONLL.OE = LOGIC1;

PWONLLm.D = !Q4 &   Q3 &  !Q2 &  !Q1 &  !Q0 & REFA10 & BSPWON
        #   Q4 &  !Q3 &  !Q2 &  !Q1 &  !Q0 & !REFA10 & BSPWON
        #   Q4 &   Q3 &   Q2 &  !Q1 &  !Q0 & BSPWON
        #   Q4 &   Q3 &  !Q2          &  !Q0 & BSPWON
        #               !Q2 &   Q1 &   Q0 & BSPWON;

PWONLLm.OE = LOGIC1;
!16MRST.D = !Q4 &  !Q3 &   Q2 &  !Q1 &   Q0 & BSPWON;

16MRST.OE = LOGIC1;

/* These are the preset and clear definitions. */
/* None are ever preset or cleared.            */

Q0.AR = 'B'0;
Q1.AR = 'b'0;
Q2.AR = 'b'0;
Q3.AR = 'b'0;
Q4.AR = 'b'0;
16MRST.AR = 'B'0;
PWONLL.AR = 'B'0;
PWONLLm.AR = 'B'0;
```

```
MYQLTO.AR  = 'B'0;
MYQLTOm.AR = 'B'0;
Q0.SP      = 'B'0;
Q1.SP      = 'b'0;
Q2.SP      = 'b'0;
Q3.SP      = 'b'0;
Q4.SP      = 'b'0;
16MRST.SP  = 'B'0;
PWONLL.SP  = 'B'0;
PWONLLm.SP = 'B'0;
MYQLTO.SP  = 'B'0;
MYQLTOm.SP = 'B'0;

PARTNO    PAL22CV10-15;
                NAME      MXM15-B ;
                DATE      08/09/89 ;
                REV       B ;
                DESIGNER  Raymond D. Bowden ;
                COMPANY   Bull HN;
                ASSEMBLY  BF8MXM 2.1 ;
                LOCATION  AP02 ;
                DEVICE    P22V10 ;

/*      CUPL VERSION 3.0                */
/*      MINIMIZATION LEVEL m1           */

/**********************************************************************/
/*
 *
 *
 *
 *                       P22V10
 *
 *                       ______
 *                      |  \/  |
 *        30USEC+00  - | 1   24 | - + 5 VOLTS
 *        16MRST-00  - | 2   23 | - Q1
 *                   - | 3   22 | - 16MSEC+00
 *                   - | 4   21 | - Q8
 *                   - | 5   20 | - Q7
 *        LOGIC1+12  - | 6   19 | - Q6
 *                   - | 7   18 | - Q5
 *                   - | 8   17 | - Q4
 *                   - | 9   16 | - Q3
 *                   - | 10  15 | - Q2
 *                   - | 11  14 | - Q0
 *           GROUND  - | 12  13 | -
 *                      |______|
 *
 *
 *
 *
 */
/**********************************************************************/
/**********************************************************************/
/*                      Functional Overview                           */
/*  This counting pal is used as a 16msec timer.  16MRST is an        */
/*  asynchronous clear from the state machine pal (MXM13).  By the    */
/*  time 16MSEC becomes true (MSB), it is safe to assume that the     */
/*  refresh counters should have turned over, or refresh is not       */
/*  working.                                                          */
/**********************************************************************/

/** Inputs **/

PIN 1    = 30USEC ;     /* 30USEC+00, Register Clock                */
PIN 2    = 16MRST ;     /* 16MRST-00, Asynchronous reset input      */
PIN 6    = LOGIC1 ;     /* WHEN PULLED LOW, ALL OUTPUTS TRISTATE    */

/** Outputs **/
```

```
PIN 14       = Q0         ;        /* Bit 0                     */
PIN 23       = Q1         ;        /* Bit 1                     */
PIN [22..15] = [Q9..2]    ;        /* Bits 9 through 2          */

MIN Q0 = 1;
MIN Q1 = 1;
MIN Q2 = 1;
MIN Q3 = 1;
MIN Q4 = 1;
MIN Q5 = 1;
MIN Q6 = 1;
MIN Q7 = 1;
MIN Q8 = 1;
MIN Q9 = 1;

/** Logic Equations **/

Q0.AR =   !16MRST;

Q1.AR =   !16MRST;

Q2.AR =   !16MRST;

Q3.AR =   !16MRST;

Q4.AR =   !16MRST;

Q5.AR =   !16MRST;

Q6.AR =   !16MRST;

Q7.AR =   !16MRST;

Q8.AR =   !16MRST;

Q9.AR =   !16MRST;

Q0.SP =   'b'0;

Q1.SP =   'b'0;

Q2.SP =   'b'0;

Q3.SP =   'b'0;

Q4.SP =   'b'0;

Q5.SP =   'b'0;

Q6.SP =   'b'0;

Q7.SP =   'b'0;

Q8.SP =   'b'0;

Q9.SP =   'b'0;

Q0.d =   Q0 $ 'b'1 ;

Q1.d =   Q1 $ Q0 ;

Q2.d =   Q2 $ [Q0..1]:& ;

Q3.d =   Q3 $ [Q0..2]:& ;

Q4.d =   Q4 $ [Q0..3]:& ;

Q5.d =   Q5 $ [Q0..4]:& ;
```

```
Q6.d = Q6 $ [Q0..5]:& ;

Q7.d = Q7 $ [Q0..6]:& ;

Q8.d = Q8 $ [Q0..7]:& ;

Q9.d = Q9 $ [Q0..8]:& ;

Q0.OE = LOGIC1;
Q1.OE = LOGIC1;
Q2.OE = LOGIC1;
Q3.OE = LOGIC1;
Q4.OE = LOGIC1;
Q5.OE = LOGIC1;
Q6.OE = LOGIC1;
Q7.OE = LOGIC1;
Q8.OE = LOGIC1;
Q9.OE = LOGIC1;
```

What is claimed is:

1. In a data processing system including a memory for storing data, a power system for providing power to the data processing system, a battery back-up means for providing power to certain of the data processing system circuitry during power system interrupts when the power system is not providing power to the data processing system, and a system manager means for monitoring the power system and asserting a system reset signal when the power system provides power to the data processing system at initial system start-up and upon restoration of power from the power system to the data processing system after a power system interrupt, the memory including memory elements for storing the data and a memory controller including a memory control means for providing memory control signals for controlling operations of the memory and a refresh means including for providing refresh signals to the memory elements, the refresh means including a refresh clock for providing a refresh clock signal indicating refresh clock cycles and a refresh counter connected from the refresh clock and responsive to the refresh clock signal for counting refresh clock cycles and providing refresh signals corresponding to the refresh clock cycles to the memory elements, the memory control means of the memory controller being connected from the power system and the memory elements and the refresh means of the memory controller being connected from the power system and from the battery back-up means, means for resetting the memory controller so that the memory control signals provided by the memory control means of the memory controller are in synchronization with the refresh signals provided by the refresh means when the power system provides power to the data processing system at initial system start-up and upon restoration of power from the power system to the data processing system after a power system interrupt, comprising:

state detection means connected from the refresh counter for detecting a change in count of the refresh counter to a count equivalent to a reset count of the refresh counter and asserting a state change signal, and memory controller reset means connected from the state detection means and connected from the system manager means and responsive to the state change signal and to the occurrence of the system reset signal for providing a memory controller reset signal to the memory controller, whereby the memory controller reset signal occurs in synchronization with the change of count of the refresh counter to the count equivalent to the refresh counter reset count, and the memory controller is responsive to the memory controller reset signal so that the memory control signals provided by the memory control means of the memory controller are in synchronization with the refresh signals provided by the refresh means.

2. The memory reset means of claim 1, further comprising:

a time-out clock means for providing a time-out clock signal indicating time-out clock cycles, a time-out counter means connected from the time-out clock means and connected from the system manager means for counting time-out clock cycles and responsive to the assertion of the reset signal and responsive to the time-out clock signal for counting time-out clock after the system reset signal has been asserted, a time-out period detection means connected from the time-out counter means and responsive to the count of time-out clock cycles in the time-out counter means after the reset signal has been asserted for providing a time out signal when the time-out counter has counted a memory refresh period plus one time-out clock cycle, wherein a memory refresh period is the number of refresh clock cycles required to refresh each of the memory elements, and a time-out detection means connected from the time-out period detection means and from the state detection means and having a memory controller reset signal output connected to the memory controller, the time-out detection means being responsive to the time-out signal and to the state change signal for providing a time-out reset signal to the memory control means and the refresh means of the memory controller when the state change signal has not been asserted during the period after the system reset signal has been asserted and the time-out counter has counted a refresh period plus one time-out clock cycle, whereby the memory control means and the refresh means of the memory controller are connected from the time-out reset signal provided by the time-out detection means and are responsive to the memory controller reset signal provided by the time-out detection means so that the memory control means and the refresh means of the memory controller are reset and the memory control means and the refresh means of the memory controller are in synchronization with the refresh clock signal.

3. In a data processing system including a memory for storing data, a power system for providing power to the data processing system, a battery back-up means for providing power to certain of the data processing system circuitry during power system interrupts when the power system is not providing power to the data processing system, and a system manager means for monitoring the power system and asserting a system reset signal when the power system provides power to the data processing system at initial system start-up and upon restoration of power from the power system to the data processing system after a power system interrupt, the memory including memory elements for storing the data and a memory controller including a memory control means for providing memory control signals for controlling operations of the memory and a refresh means including for providing refresh signals to the memory elements, the refresh means including a refresh clock for providing a refresh clock signal indicating refresh clock cycles and a refresh counter connected from the refresh clock and responsive to the refresh clock signal for counting refresh clock cycles and providing refresh signals corresponding to the refresh clock cycles to the memory elements, the memory control means of the memory controller being connected from the power system and the memory elements and the refresh means of the memory controller being connected from the power system and from the battery back-up means, a method for resetting the memory controller so that the memory control signals provided by the memory control means of the memory controller are in synchronization with the refresh signals provided by the refresh means when the power system provides power to the data processing system at initial system start-up and upon restoration of power from the power system to the data processing system after a power system interrupt, comprising the steps of:

in state detection means connected from the refresh counter, detecting a change in count of the refresh counter to a count equivalent to a reset count of the refresh counter and asserting a state change signal, and in a memory controller reset means connected from the state detection means and connected from the system manager means and responsive to the state change signal and to the occurrence of the system reset signal, providing a memory controller reset signal to the memory controller, whereby the memory controller reset signal occurs in synchronization with the change of count of the refresh counter to the count equivalent to the refresh counter reset count, and the memory controller is responsive to the memory controller reset signal so that the memory control signals provided by the memory control means of the memory controller are in synchronization with the refresh signals provided by the refresh means.

4. The method of claim 3 for resetting memory state when power is applied to the system, further comprising the steps of:

by operation of a time-out clock means, providing a time-out clock signal indicating time-out clock cycles, in a time-out counter means connected from the time-out clock means and connected from the system manager means and responsive to the assertion of the system rest signal and to the time-out clock signal, counting time-out clock cycles after the system reset signal has been asserted, in a time-out period detection means connected from the time-out counter means and responsive to the count of time-out clock cycles in the time-out counter means after the reset signal has been asserted, providing a time out signal when the time-out counter has counted a memory refresh period plus one time-out clock cycle, wherein a memory refresh period is the number of refresh clock cycles required to refresh each of the memory elements, and in a time-out detection means connected from the time-out period detection means and from the state detection means and having a time-out reset signal output connected to the memory control means and the refresh means of the memory controller, the time-out detection means being responsive to the time-out signal and to the state change signal, providing a memory controller reset signal to the memory control means and the refresh means of the memory controller when the state change signal has not been asserted during the period after the system reset signal has been asserted and the time-out counter has counted a refresh period plus one time-out clock cycle, whereby the memory control means and the refresh means of the memory controller are connected from the time-out reset signal provided by the time-out detection means and are responsive to the memory controller reset signal provided by the time-out detection means so that the memory control means and the refresh means of the memory controller are reset and the memory control means and the refresh means of the memory controller are in synchronization with the refresh clock signal.

* * * * *